United States Patent
Hatzilias et al.

(10) Patent No.: US 10,914,945 B2
(45) Date of Patent: Feb. 9, 2021

(54) INCONSPICUOUS NEAR-EYE ELECTRICAL CIRCUITS

(71) Applicant: Facebook Technologies, LLC, Menlo Park, CA (US)

(72) Inventors: Karol Constantine Hatzilias, Kenmore, WA (US); Robin Sharma, Redmond, WA (US); Christopher Yuan Ting Liao, Seattle, WA (US); Andrew Ouderkirk, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/224,554

(22) Filed: Dec. 18, 2018

(65) Prior Publication Data

US 2020/0150426 A1    May 14, 2020

Related U.S. Application Data

(60) Provisional application No. 62/758,434, filed on Nov. 8, 2018.

(51) Int. Cl.
*G02B 27/00* (2006.01)
*H05K 1/02* (2006.01)
(Continued)

(52) U.S. Cl.
CPC ..... *G02B 27/0093* (2013.01); *G02B 27/0172* (2013.01); *H05K 1/0274* (2013.01);
(Continued)

(58) Field of Classification Search
CPC ............ G02B 27/0093; G02B 27/0172; H05K 1/0274; H05K 1/09; H05K 1/115; H05K 1/181
See application file for complete search history.

(56) References Cited

U.S. PATENT DOCUMENTS

2010/0213482 A1* 8/2010 Kim .................... H01L 27/3246
257/98
2013/0114850 A1   5/2013 Publicover et al.
(Continued)

FOREIGN PATENT DOCUMENTS

EP          2499962         9/2012
WO   WO-2009071822 A2 *  6/2009   ......... H01L 51/5212
WO         2017186320       11/2017

OTHER PUBLICATIONS

Machine English translation of WO2009071822A2 (Year: 2018).*
PCT/US2019/059980 Search Report dated Apr 3, 2020.
PCT/US2019/059825 Search Report dated Mar. 24, 2020.

*Primary Examiner* — Anne M Hines
(74) *Attorney, Agent, or Firm* — Pequignot + Myers; Matthew A. Pequignot

(57) ABSTRACT

A near-eye optic includes a substrate having a clear aperture for propagating light. An inconspicuous electrical circuit is supported by the substrate in the clear aperture of the substrate. The inconspicuous electrical circuit includes a plurality of inconspicuous conductive traces disposed in an inconspicuous pattern and electrically coupled to a plurality of inconspicuous electrical components. The inconspicuous pattern may include e.g. an asymmetric pattern, an aperiodic pattern, a pseudo-random pattern, a meandering pattern, a periodic pattern modulated with pseudo-random perturbations, or a non-rectangular pattern modulated with pseudo-random perturbations.

19 Claims, 16 Drawing Sheets

(51) Int. Cl.
    *H05K 1/09*           (2006.01)
    *H05K 3/02*           (2006.01)
    *H05K 1/18*           (2006.01)
    *G02B 27/01*         (2006.01)
    *H05K 1/11*           (2006.01)
    *H05K 3/12*           (2006.01)

(52) U.S. Cl.
    CPC ............... *H05K 1/09* (2013.01); *H05K 1/115* (2013.01); *H05K 1/181* (2013.01); *H05K 3/027* (2013.01); *H05K 3/12* (2013.01); *G02B 2027/0178* (2013.01); *H05K 2201/0108* (2013.01); *H05K 2201/10121* (2013.01)

(56) References Cited

U.S. PATENT DOCUMENTS

| | | |
|---|---|---|
| 2015/0062322 A1 | 3/2015 | Gustafsson et al. |
| 2015/0173602 A1* | 6/2015 | Barrows ................ A61B 3/101 |
| | | 600/345 |
| 2016/0270655 A1 | 9/2016 | Caraffi et al. |
| 2017/0255011 A1 | 9/2017 | Son et al. |
| 2018/0348524 A1* | 12/2018 | Blum ................ H01L 51/5275 |

* cited by examiner

INCONSPICUOUS NEAR-EYE ELECTRICAL CIRCUITS

REFERENCE TO RELATED APPLICATION

The present application claims priority from U.S. Provisional Application No. 62/758,434 filed on Nov. 9, 2018, and incorporated herein by reference in its entirety.

TECHNICAL FIELD

The present disclosure relates to near-eye devices, and in particular to wearable optical, optoelectronic, and electro-optical devices for eye region tracking, their components, modules, and related methods of manufacture and operation.

BACKGROUND

Near-eye optics (NEO) are used to correct vision defects, gather information about eye position and orientation, capture an external visual scene for a user, or, when coupled with additional electronics such as a near-eye display, to augment a real scene with additional information or virtual objects. In some NEO systems, a head, face, and/or eye position and orientation of the user are tracked using a near-eye tracker (NET), and the tracked information is used to infer the user's intent, communicate the user's facial expression, or to augment a real-world scene with virtual images, symbols, or signs.

The eye region may be tracked by illuminating the eye with an array of miniature illuminators. Real-time images of the illuminated eye are obtained using a dedicated imaging system, and fed to a controller. It is desirable to increase fidelity and reliability of eye tracking.

BRIEF DESCRIPTION OF THE DRAWINGS

Exemplary embodiments will now be described in conjunction with the drawings, in which.

DETAILED DESCRIPTION

Figure 1:
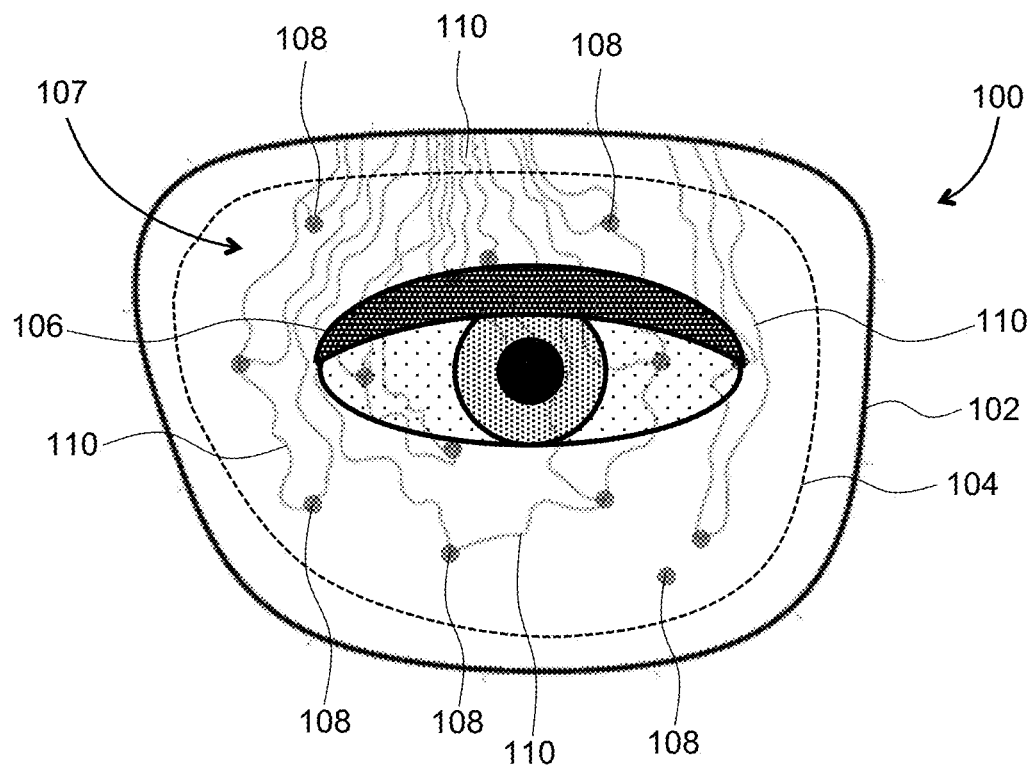
FIG. 1 is a schematic frontal view of a near-eye optic.

While the present teachings are described in conjunction with various embodiments and examples, it is not intended that the present teachings be limited to such embodiments. On the contrary, the present teachings encompass various alternatives and equivalents, as will be appreciated by those of skill in the art. All statements herein reciting principles, aspects, and embodiments of this disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

As used herein, the terms "first", "second", and so forth are not intended to imply sequential ordering, but rather are intended to distinguish one element from another, unless explicitly stated. Similarly, sequential ordering of method steps does not imply a sequential order of their execution, unless explicitly stated.

In accordance with the present disclosure, there is provided a near-eye optic (NEO) comprising a substrate having a clear aperture for propagating light therethrough, and an inconspicuous electrical circuit supported by the substrate in its clear aperture. The inconspicuous electrical circuit comprises a plurality of inconspicuous conductive traces disposed in an inconspicuous pattern and electrically coupled to a plurality of inconspicuous electrical components. The inconspicuous pattern may include e.g. at least one of: an asymmetric pattern, an aperiodic pattern, a pseudo-random pattern, a meandering pattern, a periodic pattern modulated with pseudo-random perturbations, or a non-rectangular pattern modulated with pseudo-random perturbations. The NEO may include e.g. a display, a prescription lens, an active focusing optic, an attenuator, a shutter, or a near-eye tracker.

In some embodiments, the plurality of inconspicuous conductive traces lacks conductive traces disposed within 12 degrees of an optic axis of the clear aperture. The substrate is preferably transparent for visible light across the clear aperture. The inconspicuous pattern may include a periodic pattern modulated with pseudo-random perturbations. The amplitudes of the pseudo-random perturbations may be e.g. less than 2000× widths of the inconspicuous conductive traces. Lengths of the pseudo-random perturbations may be e.g. less than ⅓ of total lengths of the inconspicuous conductive trace and at least 2× widths of the inconspicuous conductive traces.

In some embodiments, the inconspicuous conductive traces comprise metal traces defined by photolithography and at least one of etching or plating, and/or conductive ink traces formed by at least one of Intaglio printing, screen printing, flexographic printing, or ink jet printing. The conductive traces may include a transparent conductor comprising at least one of an oxide or graphene, and may be defined by at least one of laser ablation or shadow masking.

In accordance with the present disclosure, there is provided an illumination substrate comprising a transparent baseplate having a clear aperture for propagating external light to an eye region of a user. A plurality of inconspicuous conductive traces are disposed in an inconspicuous pattern. At least a portion of the plurality of inconspicuous conductive traces is supported by the transparent baseplate in the clear aperture of the baseplate. A plurality of inconspicuous semiconductor illuminators may be configured for illuminating the eye region, supported by the transparent baseplate in the clear aperture thereof, and electrically coupled to the plurality of inconspicuous conductive traces. The inconspicuous pattern may include at least one of: an asymmetric pattern, an aperiodic pattern, a pseudo-random pattern, a meandering pattern, a periodic pattern modulated with pseudo-random perturbations, or a non-rectangular pattern modulated with pseudo-random perturbations.

In some embodiments, a planarization layer is provided for the illumination substrate. The planarization layer is supported by the transparent baseplate and surrounding each semiconductor illuminator of the plurality of inconspicuous semiconductor illuminators, such that at least a portion of the inconspicuous conductive traces is supported by the planarization layer. Each inconspicuous semiconductor illuminator may include top and bottom electric terminals and a passivation layer, such that the top electric terminal is in electrical contact with an inconspicuous conductive trace by a conductor formed on the passivation layer. In some embodiments, each inconspicuous semiconductor illuminator of the plurality of inconspicuous semiconductor illuminators comprises top and bottom electric terminals. The top electric terminal is in electrical contact with an inconspicuous conductive trace of the plurality of inconspicuous conductive traces through a via in the inconspicuous semiconductor illuminator.

In accordance with the present disclosure, there is further provided a method for manufacturing a NEO. The method includes providing a substrate having a clear aperture for propagating light through the substrate, disposing a plurality of inconspicuous conductive traces in an inconspicuous pattern on the substrate, and electrically coupling the plurality of inconspicuous conductive traces to a plurality of inconspicuous electrical components supported by the substrate in the clear aperture of the substrate.

In embodiments where the inconspicuous conductive traces comprise metal traces, the method may further include defining the metal traces by photolithography and at least one of etching or plating. In embodiments where the inconspicuous conductive traces comprise conductive ink traces, the method may further include forming the conductive ink traces by at least one of: Intaglio printing, screen printing, flexographic printing, or ink jet printing.

Referring now to FIG. 1, a near-eye optic (NEO) 100, such as a near-eye display (NED) or a near-eye tracker (NET), includes a substrate 102 having a clear aperture 104 for propagating light generally towards an eye 106. The light may be, for example, external light from outside environment, NEO internally generated light, light from an integrated display or from an external display, etc. The light may be in the visible wavelength range, or in a different range, such as infrared (IR) or ultraviolet (UV). The substrate 102 can be transparent for the light in the clear aperture 104. The clear aperture 104 receives the light for performing intended function of the NEO 100.

Figure 2:
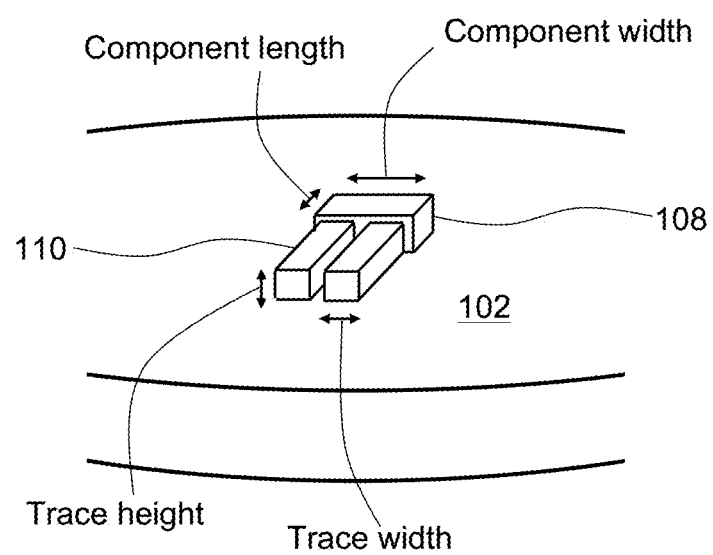
FIG. 2 is a schematic isometric view of a substrate of the near-eye optic of FIG. 1, the substrate supporting an electrical component and conductive traces.

An inconspicuous electrical circuit 107 is supported by the substrate 102 in the clear aperture 104 of the substrate 102. The inconspicuous electrical circuit 107 includes a plurality of inconspicuous conductive traces 110 disposed in an inconspicuous pattern and electrically coupled to a plurality of inconspicuous electrical components 108. The inconspicuous electrical components 108 may include, for example, light-emitting diodes (LEDs), laser diodes (LDs) such as vertical cavity surface-emitting lasers (VCSELs) or side-emitting laser diodes, photodiodes, transistors, resistors, capacitors, etc., or more generally any miniature optical, electro-optical, optoelectronic, or electrical components or sensors that may benefit from in-sight placement. The sensors and/or detectors may detect various parameters such as eye distance, illumination level, pupil dilation, etc. The term "inconspicuous" means not immediately noticeable by either the wearer of the NEO 100 or outside observers such as other persons in a direct face-to-face communication with a wearer of the NEO. Opaque electrical components such as LEDs, VCSELs, or photodiodes, are often imperceptible to the user wearing the NEO at an eye relief distance closer than 25 mm from the eye 106 when the electrical components are less than 500 µm in length and less than 500 µm in width. Opaque electronics that are less than 250 µm are often imperceptible to an outside observer who is greater than 200 mm away from the NEO 100. It is also possible to fabricate and incorporate transparent or semi-transparent electronics such as capacitors and resistors, which can be incorporated into the NEO. These transparent or semi-transparent electrical components can be imperceptible at different sizes and distances than opaque inconspicuous electrical components. The length and width of the electrical components are illustrated in FIG. 2.

The electrical components 108 of FIG. 1 are electrically coupled to a plurality of inconspicuous conductive traces 110 for powering the electrical components 108, for receiving electrical signals from the electrical components 108, or both. For users wearing the NEO 100 closer than 25 mm from the eye 106, opaque conductive traces are often imperceptible if they are less than 50 µm wide and no greater than 50 µm in height. For an external observer greater than 200 mm away observing someone wearing the NEO 100, the conductive traces are often imperceptible if they are less than 25 μm wide and less than 25 μm in height. The distance of 200 mm away is much closer than a distance in most social contact situations. Transparent traces can be inconspicuous at different sizes and distances than opaque traces at this distance. The width and height of the electrical components are illustrated in FIG. 2.

In accordance with the present disclosure, the inconspicuous conductive traces 110 may be disposed in an inconspicuous pattern. The inconspicuous pattern can be any pattern that is not immediately familiar or recognizable by a human eye. By way of non-limiting examples, the electrical components 108 may be disposed in a periodic pattern such as a sinusoid, an asymmetric pattern, an aperiodic pattern, a repeating random, a repeating pseudo-random pattern, a non-linear pattern, a pseudo-random pattern, a meandering pattern, a non-circular pattern, a periodic pattern modulated with random or pseudo-random perturbations, a geometric (arcs, circles, sinusoids, etc.) pattern modulated with random or pseudo-random perturbations, and/or a non-rectangular pattern.

Figure 3A:
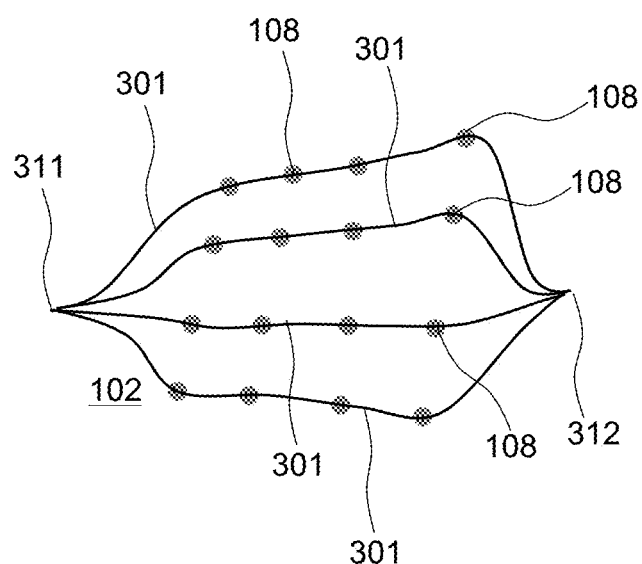
FIG. 3A is an exemplary schematic view of an asymmetric inconspicuous conductive trace pattern.

FIG. 3A shows an example of inconspicuous conductive traces 301 disposed on the substrate 102 in an asymmetric pattern. The inconspicuous conductive traces 301 include four branches joined at ends 311, 312. Within each branch, the electrical components 108 are connected in series. It is to be understood that the electrical components 108 can be connected in series, in parallel, individually, or in any combination of the above, depending on the components nature and function; for example electrical components such as illuminators may be connected in series, in several branches connected in series, etc. An asymmetric pattern lacks an axis of symmetry, e.g. left and right, or top and bottom groups of the inconspicuous conductive traces 301 cannot be mirrored onto one another. An asymmetric pattern may be inconspicuous, because an eye of a user tends to look for symmetry in observed shapes, and consequently asymmetric shapes can be less noticeable to the eye.

Figure 3B:
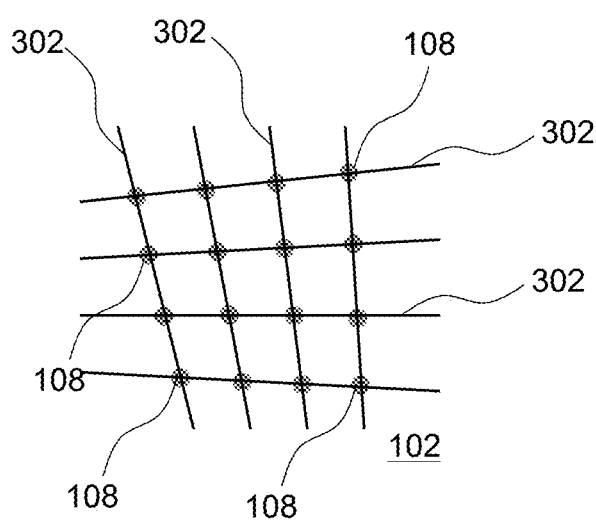
FIG. 3B is an exemplary schematic view of an aperiodic inconspicuous conductive trace pattern.

FIG. 3B shows inconspicuous conductive traces 302 disposed on the substrate 102 in an aperiodic grid pattern. Neighboring electrical components 108 are disposed at the crossing points of the inconspicuous conductive traces 302, at different distances from each other along the inconspicuous conductive traces 302. One example of electrical components that may benefit from a grid-like configuration of the inconspicuous conductive traces 302 is electronic gates, or field transistors, which can be used to control other in-field inconspicuous electrical components, for example. The distances between neighboring inconspicuous conductive traces 302 may gradually increase or decrease, or may be completely random or pseudo-random. An aperiodic pattern tends to be inconspicuous because it is difficult for an eye to predict.

Figure 3C:
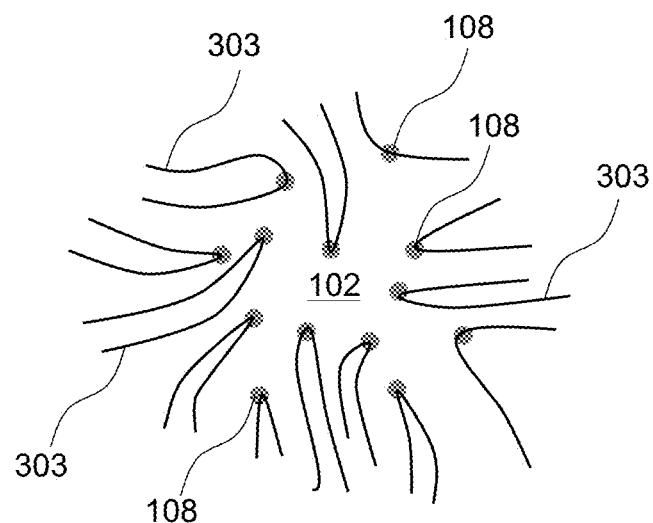
FIG. 3C is an exemplary schematic view of a pseudo-random inconspicuous conductive trace pattern.

FIG. 3C shows an example of inconspicuous conductive traces 303 individually connecting the inconspicuous electrical components 108. The inconspicuous conductive traces 303 and the inconspicuous electrical components 108 are arranged in a random or pseudo-random pattern on the substrate 102. Throughout this specification, the terms "random" or "pseudo-random" are interchangeable and refer to a pattern which may appear random, even though it may have been obtained through a deterministic algorithm providing x, y coordinates of the electrical components 108 by processing some seed number, which may be randomly picked. Random patterns may be difficult for an eye to "grab" and interpret, and thus may appear inconspicuous. It is further noted that random or pseudo-random patterns, as defined herein, may include repeating random fragments which may look generally similar or belong to a same category of shapes, but disposed randomly on the substrate 102, or in a grid configuration on the substrate 102. For example, in FIG. 3C, the general shape of each pair of the inconspicuous conductive traces 303 is an acute angle or L-shape, which, for some of the electrical components 108, may be repeated, but disposed at a different or random orientation angle on the substrate 102.

Figure 3D:
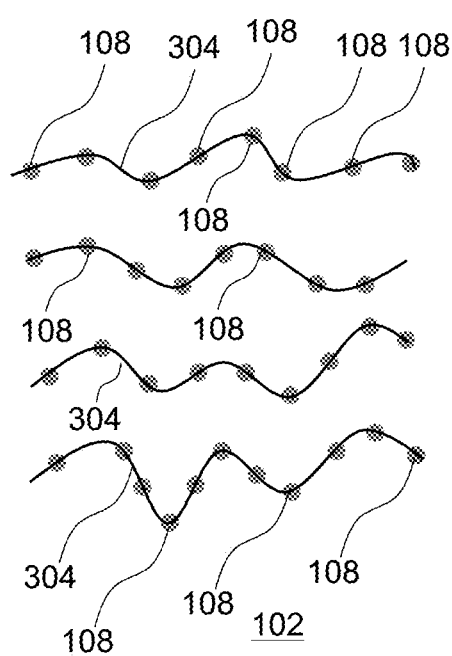
FIG. 3D is an exemplary schematic view of a meandering inconspicuous conductive trace pattern.

FIG. 3D shows another example of inconspicuous placement of inconspicuous conductive traces 304. The electrical components 108 of FIG. 3D are disposed along meandering, waving, or wiggling inconspicuous conductive traces 304, which make random turns of different amplitudes to the left and to the right, not necessarily in order. The electrical components 108 within each wiggling or meandering inconspicuous conductive trace 304 are connected in series. Since the meandering inconspicuous conductive traces 304 may be difficult for an eye to predict or follow, the electrical circuitry are less noticeable. The meandering inconspicuous conductive traces 304 may also include sinusoidal traces, with constant or varying amplitude and spatial period.

Figure 3E:
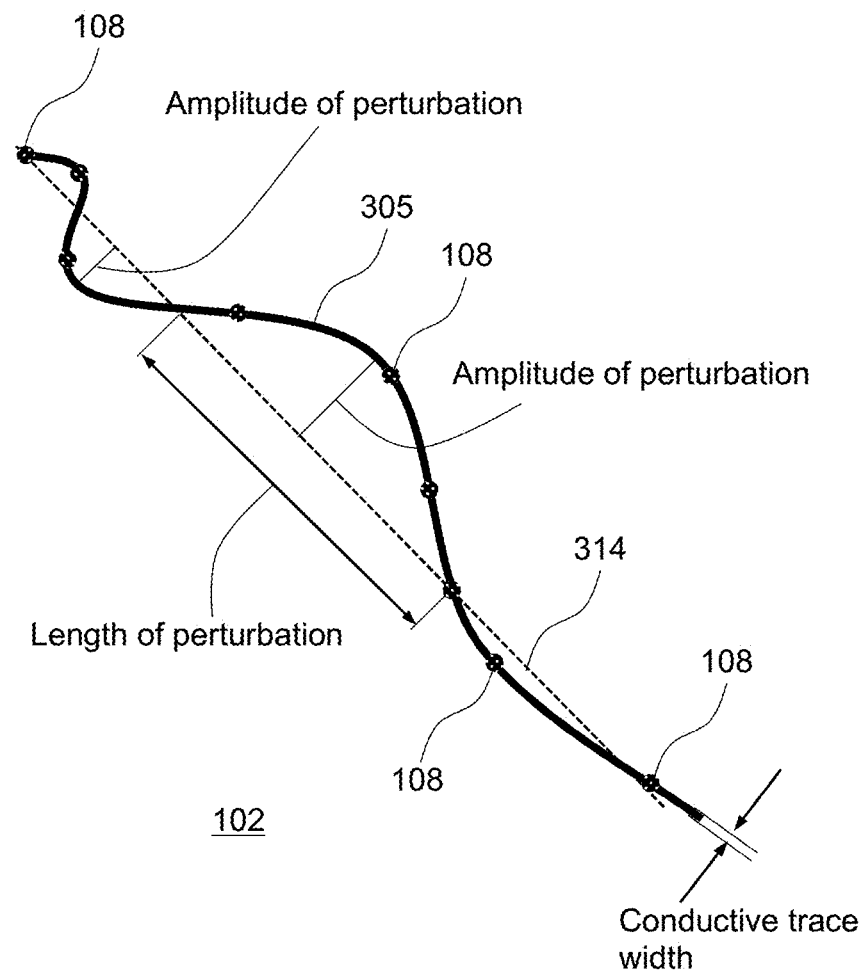
FIG. 3E is an exemplary schematic view of a periodic inconspicuous conductive trace pattern modulated with pseudo-random perturbations.

Position and shape of inconspicuous conductive traces may be based on some periodic pattern or grid, such as, for example, a rectangular periodic grid, a radial grid, a concentric circular grid, etc., with pseudo-random perturbations or deviations added to make the traces less noticeable. Referring to FIG. 3E, an inconspicuous conductive trace 305 deviates randomly from a linear shape 314. A length of a perturbation is defined herein as a distance between neighboring crossings of the inconspicuous conductive trace 305 and the linear shape 314 or another grid shape. An amplitude of a perturbation is a maximum distance between the inconspicuous conductive trace 305 and the linear shape 314 or another grid shape, as the case may be.

The amplitude of the pseudo-random perturbations may be limited by some threshold value, for example less than 2000×, 1000×, 500×, or 250× width of the inconspicuous conductive trace 305. The length of the pseudo-random perturbations may also be limited to be less than some threshold value, for example less than ⅕ or ⅓ of total length of the inconspicuous conductive trace 305 and at least 2×, or at least 3×, or at least 5× widths of the inconspicuous conductive trace 305. It is further noted that some of the electrical components 108 may remain on-grid 304, that is, their perturbations may be zero. The pseudo-random perturbations can make the grid of the inconspicuous conductive trace 305 and the inconspicuous electrical components 108 less noticeable, in comparison with the electrical components 108 disposed strictly on-grid. The amplitude of X- or Y-perturbations of the electrical components 108 from the grid may be e.g. at least 1%, 2%, 5%, 10%, 20%, or 50% of the corresponding X or Y grid period, for example. In some embodiments, the amplitudes of perturbations are less than a fixed threshold distance, e.g. less than 2 mm, 5 mm, or 10 mm. Other types of regular grids that may be modulated with random or pseudo-random perturbations include azimuthal grids having regularly spaced azimuth angle and radius, hexagonal or polygonal grids, radial grids, etc.

Figure 3F:
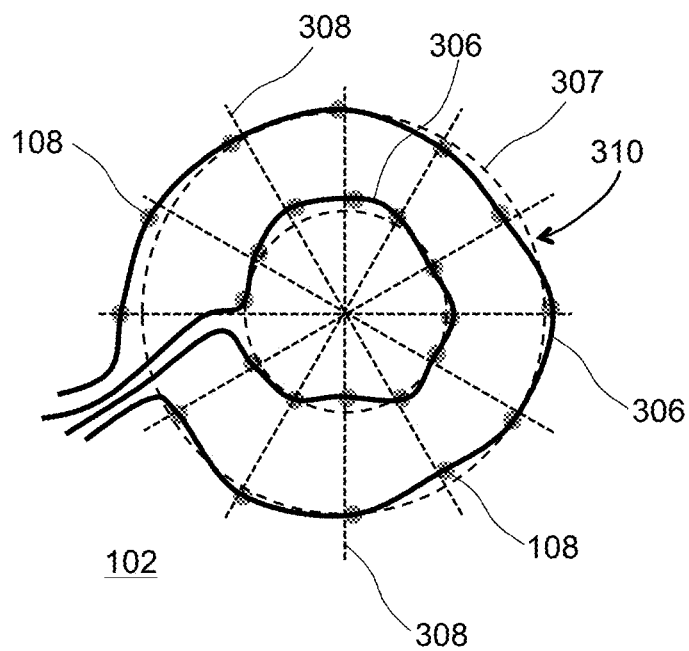
FIG. 3F is an exemplary schematic view of a polar angle inconspicuous pattern modulated with pseudo-random perturbations.

FIG. 3F shows an example of placement of inconspicuous conductive traces and inconspicuous electrical components off radial or a polar angle grid 310 formed by equidistant azimuthal lines 307 and equiangular radial lines 308, both shown with dashed lines. The electrical components 108 are disposed near points of intersections of the azimuthal lines 307 and the radial lines 308, with varying or pseudo-random offsets from the points of intersections, to make the disposition pattern of the electrical components 108 less conspicuous, that is less noticeable to a human eye. The pseudo-random offset of the electrical components 108 makes them less noticeable, and furthermore, it may facilitate the fidelity of gaze detection. Since the electrical components 108 are disposed asymmetrically, a gaze detection system may identify origins of the detected glints more easily by reducing or avoiding uncertainty of the glint origin determination.

The amplitude of pseudo-random perturbations of inconspicuous conductive traces 306, shown with thick solid lines, may be selected to be less than 2000×, 1000×, 500×, or 250× width of the inconspicuous conductive trace 305. The amplitude of the offsets may be e.g. at least 1%, 2%, 5%, 10%, 20%, or 50% of the corresponding angular period of the equiangular radial lines 308, and/or at least 1%, 2%, 5%, 10%, 20%, or 50% of the corresponding azimuthal lines 306 period, for example. In some embodiments, the amplitudes of the offsets are less than a fixed threshold distance, e.g. less than 2 mm, 5 mm, or 10 mm.

Figure 4:
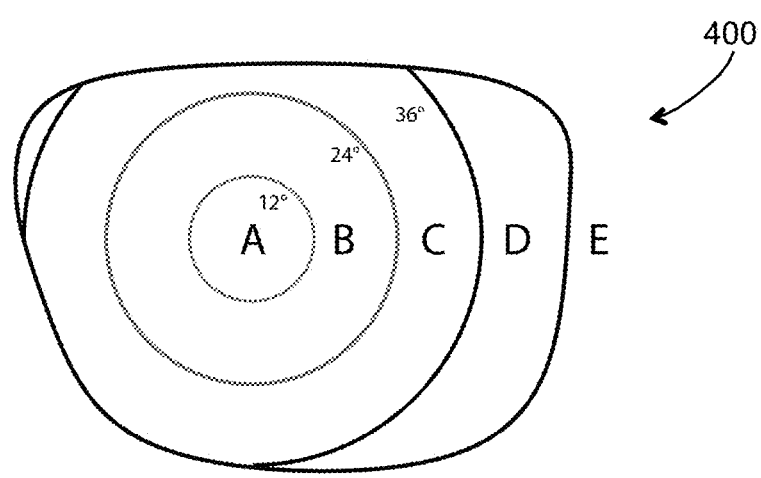
FIG. 4 is a schematic view of different viewing regions of a near-eye optic.

A total field of view of the NEO 100 may be separated into several viewing cones or regions having different levels of importance or frequency of use. For example, referring to FIG. 4, an NEO 400 may include a central viewing area A of no greater than 12 degrees away from an optic axis, a first peripheral viewing area B, a second peripheral viewing area C, a third peripheral viewing area D, and an outside area E, with the step of 12 degrees up, i.e. 24 degrees, 36 degrees, etc. In many NEO applications, the eye spends most of the time gazing in a direction of the central viewing area A. Accordingly, in some embodiments, the inconspicuous electrical components are placed in the areas B, C, and D, while avoiding the central viewing area A. In other words, the plurality of inconspicuous conductive traces and/or the plurality of electrical components lacks electrical components disposed in the central viewing area A, that is, within 12 degrees of an optic axis of the clear aperture. Since the eye spends most of the time gazing within the central viewing area A lacking the electrical components, the latter are less likely to be noticed when disposed outside of the central viewing area A.

Figure 5A:
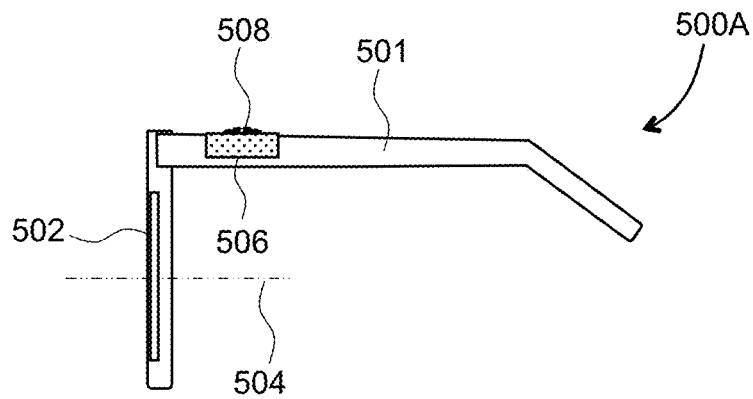
FIG. 5A is a side cross-sectional view of a near-eye optic comprising an active focusing optic.

Various types of NEO 100 of FIG. 1 may benefit from inconspicuous conductive traces and inconspicuous electronic components within the clear aperture of the NEO 100. Referring to FIG. 5A, an NEO 500A has a form factor of a pair of eyeglasses 501. The NEO 500A includes an active focusing optic 502 having a tunable or switchable optical power. Herein, the term "optical power", when used in a context of an imaging or light gathering component, refers to focusing or defocusing power commonly expressed in Diopters. The active focusing optic 502 has an optic axis 504 and may include, for example, a tunable lens such as a liquid lens or a liquid crystal (LC) lens, a switchable lens such as Pancharatnam-Berry phase (PBP) LC lens for dynamic, e.g. gaze-dependent, correction of vision defects such as myopia, presbyopia, etc. The tunable or switchable lens may be controlled by a controller 506 and/or also be manually controlled by means of a finger dial 508. The inconspicuous electrical components for this type of device may include, for example, inconspicuous transistors, resistors, switches, sensors, etc. These inconspicuous electrical components may be coupled to inconspicuous conductive traces running to an edge of the active focusing optic 502, where they may be coupled to the controller 506 via a thin electrical cable, not shown.

Figure 5B:
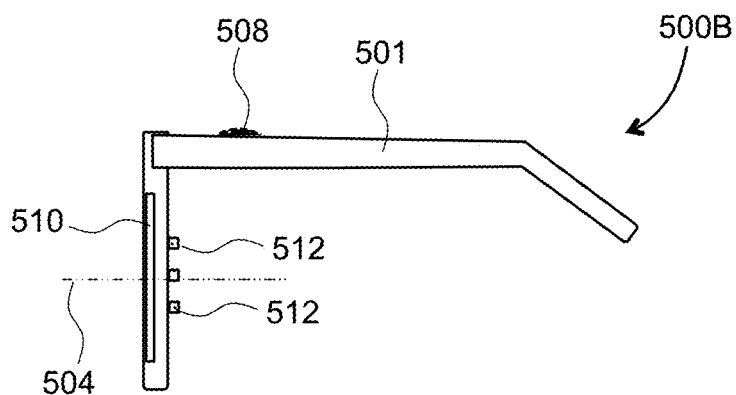
FIG. 5B is a side cross-sectional view of a near-eye optic comprising an attenuator or shutter.

Referring to FIG. 5B, an NEO 500B has a form factor of the pair of eyeglasses 501. The NEO 500B includes an attenuator 510 having a tunable or switchable optical attenuation level, commonly expressed in decibels (dB). The NEO 500B is essentially a pair of tunable or switchable sunglasses, with attenuation adjustable by the finger dial 508. The attenuation may also be made gaze-dependent. The inconspicuous electrical components for this type of device may include, for example, inconspicuous photodetectors 512 coupled to a controller by thin inconspicuous electrical traces. The inconspicuous photodetectors 512 can measure the illumination level in the clear aperture of the NEO 500B with the purpose of e.g. stabilizing the illumination level at some pre-defined user-selectable value. For example, when the wearer of the NEO 500B enters a shade, the attenuation level of the attenuator 510 may automatically decrease, thus avoiding a problem of low visibility in the shaded areas—a common problem with regular, passive sunglasses. Conversely, when the wearer of the NEO 500B enters a sunlit area, the attenuation level of the attenuator 510 may increase accordingly, keeping the illumination level within comfortable levels regardless of an ambient level of illumination. The NEO 500B may also include an optical shutter for blocking external light completely, e.g. when switching from a glasses mode to a virtual reality (VR) display mode.

Figure 5C:
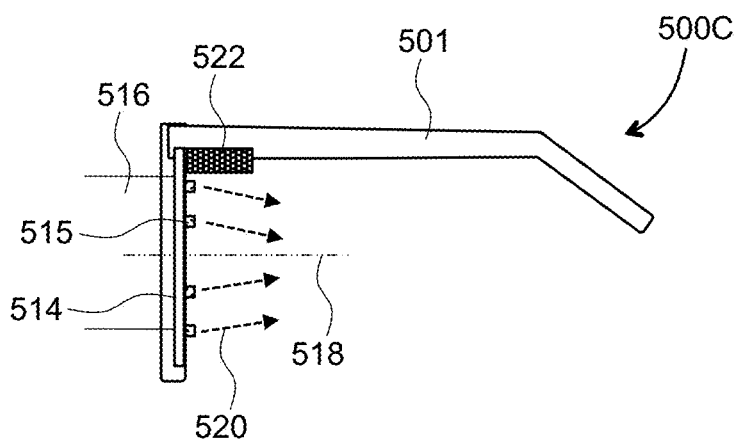
FIG. 5C is a side cross-sectional view of a near-eye optic comprising a near-eye tracker.

Turning to FIG. 5C, an NEO 500C has a form factor of the pair of eyeglasses 501. The NEO 500C includes a near-eye tracker (NET) for dynamically tracking an eye region of a user, i.e. an area of the face including both eyes. The NEO 500C includes a substrate 514 having a clear aperture 516 with an optic axis 518. The substrate 514 supports a plurality of inconspicuous illuminators 515, e.g. vertical-cavity surface-emitting lasers (VCSELs), which may be coupled in sequence, in parallel, or in sequential groups to a power source via a plurality of inconspicuous traces. The plurality of inconspicuous illuminators 515 may be configured and oriented to illuminate the eye area, typically with infrared light 520 to avoid distracting the user with bright visible light. The clear aperture 516 of the substrate 514 may be made transparent for visible light, such as external light from outside environment. The substrate 514 may include an optical element, such as a switchable lens or a switchable grating, for redirecting a least a portion of the illuminating light 520 reflected from the eye region towards an imaging system 522 for imaging the eye region. The eye region may include eye brows, nose bridge, outer canthus of both eyes, and down to the check bone under both eyes. The eye region includes the eye itself, and of particular interest to gaze tracking are the cornea, the iris, and the pupil. At least one of the following may be tracked: a position or orientation of user's eye(s); a position of cornea, iris, or pupil of each eye; position or state of eyelid(s) such as open or closed, position or shape of eyebrows; a facial expression; etc.

Figure 6:
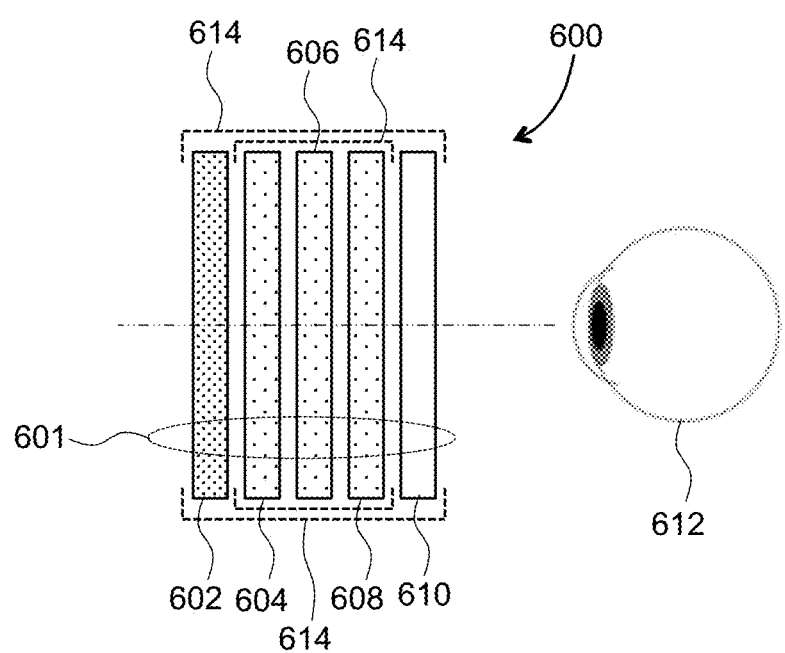
FIG. 6 is a side cross-sectional view of a near-eye optic comprising a stack of functional substrates.

Referring to FIG. 6, an NEO 600 is an embodiment of the NEO 100 of FIG. 1, the active focusing NEO 500A of FIG. 5A, the variable attenuator/shutter NEO 500B of FIG. 5B, or the NET NEO 500C of FIG. 5C. The NEO 600 of FIG. 6 includes a stack 601 of functional substrates 602, 604, 606, 608, and 610, each substrate serving a dedicated function, such as light guiding and coupling, light attenuation or amplification, illumination of user's eye region, outside illumination, distances sensing, etc. The functional substrates 602, 604, 606, 608, and 610 may include, for example, transparent near-eye display units for displaying images to an eye 612, transparent pupil-replicating waveguides of an augmented reality (AR) display system, opaque display units or pupil-replicating waveguides of a virtual reality (VR) display system, prescription lenses having active optics with switchable or tunable optical power, that is, focusing/defocusing power, optical structures with variable transmission for blocking or or attenuation of the outside light, switchable diffraction gratings, Bragg gratings, holographic gratings, sensor substrates, etc. Various combined functions and smart applications may be enabled by stacking various functional substrates, such as gaze-dependent eyesight correction, gaze-dependent light attenuation and conditioning, image and video displaying, outside illumination, etc. The stack 601 may be provided with spacers 614 that keep individual functional substrates 602, 604, 606, 608, and 610 in a pre-defined spaced-apart relationship. The stack 601 may be fixed or reconfigurable. The spacers 614 may be bulk spacers and/or beads of glass or another material embedded in a perimeter epoxy gasket. Alternatively, each element in the optic assembly could be built on top of the previous element in a process like overmolding.

The functional substrates 602, 604, 606, 608, and 610 may include inconspicuous conductive traces and inconspicuous electrical components in-sight of the eye 612, i.e. within clear apertures of the transparent substrate units. As noted above, VCSEL illuminators mounted on transparent substrates within the clear aperture can be used for illumination of the eye region of the user's face, with the inconspicuous conductive traces carrying the VCSEL's driving current. Placement of the illuminators in the line of sight of the user has advantages of a more uniform illumination and eye gaze detection with a higher fidelity.

Inconspicuous conductive traces may be applied to one or more of the surfaces of the functional substrates 602, 604, 606, 608, and 610. In some embodiments the functional substrates 602, 604, 606, 608, and 610 are multilayered. In some embodiments the functional substrates 602, 604, 606, 608, and 610 are composed of e.g. glass, sapphire, film, or plastic.

Figures 7A, 7B:
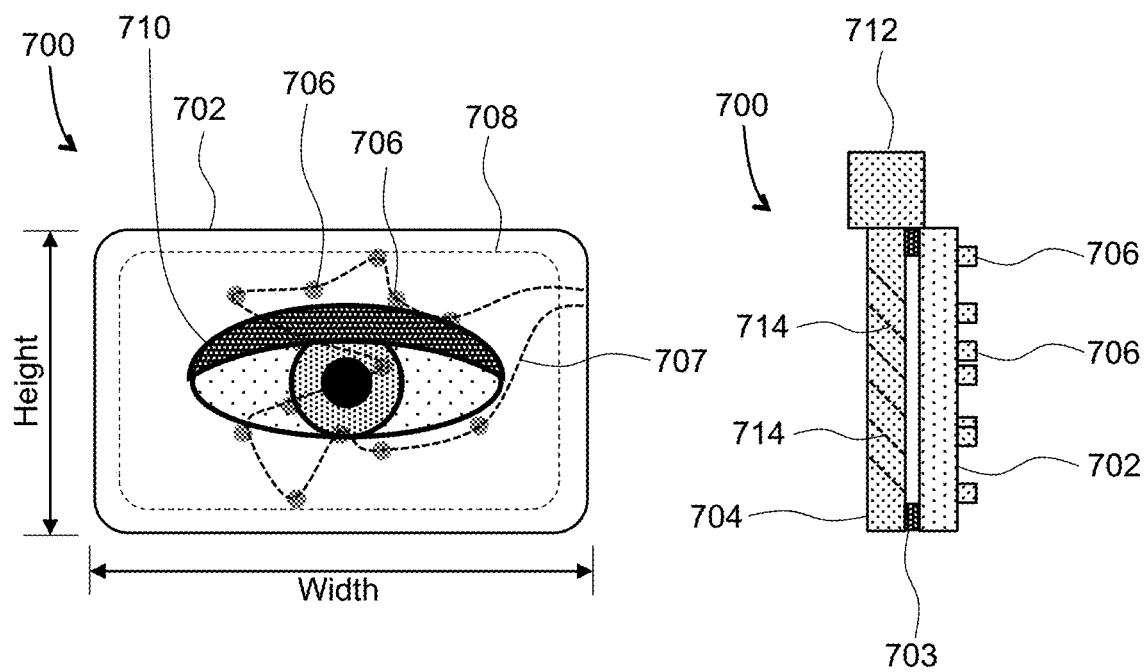
FIGS. 7A and 7B are schematic frontal and side cross-sectional side views, respectively, of a near-eye tracker according to an embodiment.

Referring to FIGS. 7A and 7B, an NET 700 includes an eye-tracking illumination substrate 702 and an eye-tracking imaging substrate 704 in a stack configuration. The eye-tracking illumination substrate 702 includes inconspicuous illuminators 706 for illuminating the eye region, powered through inconspicuous conductive traces 707. The inconspicuous conductive traces 707 are disposed in an inconspicuous pattern, e.g. any pattern shown in FIGS. 3A to 3F, within a clear aperture 708 of the eye-tracking illumination 702 and imaging 704 substrates in the field of view of a user's eye 710. The eye-tracking illumination 702 and imaging 704 substrates can be transparent for visible light across the clear aperture 708. An imaging system 712, e.g. a camera system coupled to an optical sensor, can be optically coupled to the eye-tracking imaging substrate 704. The eye-tracking imaging substrate 704 can include an optical element 714 such as, for example, a holographic, refractive, or diffractive optic for redirecting a least a portion of the illuminating light reflected from the eye 710 towards the imaging system. The eye-tracking illumination 702 and imaging 704 substrates can be held in a fixed spaced-apart relationship by a spacer 703. In some embodiments, the width and the height of the NET are between 30×30 mm and 150×150 mm. Thicknesses of each one of the eye-tracking illumination 702 and imaging 704 substrates may be e.g. between 0.25 mm and 10 mm.

In some NET embodiments, individual illuminators can be provided with a plurality of illuminator-specific characteristics or features, which may make identification of reflections of the illuminators in a user's eye ("glints") more straightforward. In some embodiments, the illuminators are grouped in individually shaped clusters. This may allow the detection system to associate corresponding detected reflections with originating illuminator clusters, thereby avoiding uncertainty with determining origins of the glints. Consequently, the eye gaze direction and position may be determined in a more reliable and robust manner.

In some NET embodiments, the illuminators may have specific or unique features such as individual optical power density distributions, which can serve as "signatures" of individual illuminators. To obtain specific optical power density distributions, the illuminators may be provided with unique amplitude, phase, or amplitude/phase masks creating required "signature" optical power density distributions. The gaze detection system may be able to recognize the signature optical power density distributions, thereby improving reliability of glint identification and gaze determination.

In some embodiments, individual illuminators, being point-source or extended light sources, groups of illuminators, etc. may be operated at different known or controllable optical power levels. The gaze detection system may be able to determine the origins of individual glints by comparing optical power levels from different glints on an eye image. In some embodiments, the distance and directivity of individual illuminators may be selected such as to avoid two illuminators shining within a corneal area of a user's eye at once, thereby lessening maximum optical power entering the eye and potentially reaching a retina of the eye. Furthermore, a minimum distance between individual illuminators may be selected such as to avoid coalescence of individual glints and thus improve robustness of detecting the eye position and gaze direction. By way of a non-limiting example, the illuminators can be disposed at least 5 mm away from each other.

Figure 8:
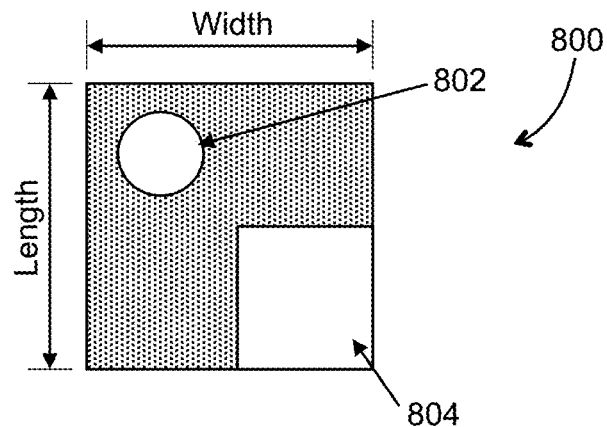
FIG. 8 is a schematic top view of a near-eye vertical cavity surface emitting laser (VCSEL) illuminator including top and bottom electrical terminals.

Referring to FIG. 8, a VCSEL 800 is an example of a semiconductor illuminator suitable for eye region illumination in NET devices described herein. For example, the VCSELs 800 can be used as illuminators 515 in the NET 500C of FIG. 5C, or as the illuminators 706 in the NET 700 of FIGS. 7A and 7B. The VCSEL 800 (FIG. 8) includes a light emission area 802 and an electrical contact area 804. The light emission area 802 may contain beam shaping, directing, and/or collimating optics for providing desired characteristics of emitted optical beam such as divergence, chief ray angle, etc. The optics may include refractive optics, diffractive optics, micro- or nanostructures with desired optical characteristics, etc. The optics can also be provided in a separate layer. The length and width of the VCSEL 800 can be less than 500 μm allowing an inconspicuous use at an eye relief distance closer than 25 mm. Preferably, the length and width of the VCSEL 800 are less than 100 μm, such that the VCSEL 800 is imperceptible to an outside observer who is greater than 200 mm away from the user.

The electrical contact area 804 typically includes a top terminal and a bottom terminal, and accordingly electrical contacts need to be made on two different planes. The top terminal might be connected back to the substrate plane by a wirebond extending upwards from the top contact. To protect the wirebond, the entire structure would need to be encapsulated by providing an encapsulating layer completely covering all wirebonds of VCSELs on the substrate. Such an encapsulating layer can add a significant extra thickness to the entire structure.

Figure 9:
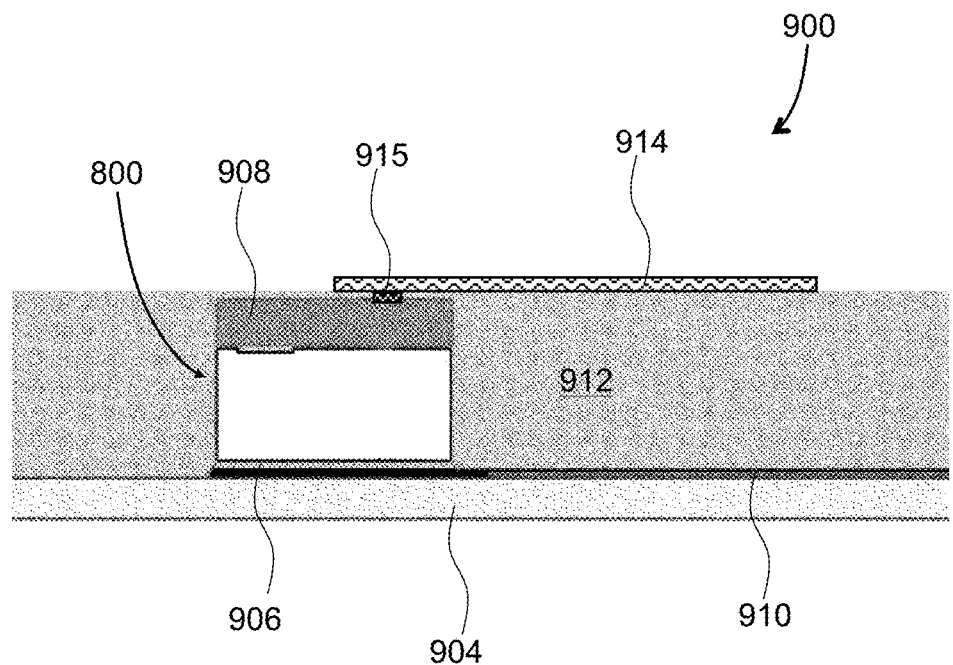
FIG. 9 is a side cross-sectional view of an illumination substrate supporting the near-eye VCSEL illuminator of FIG. 8 and having inconspicuous conductive traces at two levels.

In accordance with the present disclosure, the wirebonds may be done away with. Referring to FIG. 9, an illumination substrate 900 can be used e.g. to illuminate an eye area in an NET described above. The illumination substrate 900 includes the VCSEL 800 of FIG. 8 supported by a transparent baseplate 904. The VCSEL 800 has a bottom electrical terminal 906 in plane of the transparent baseplate 904, and a top electrical terminal 908 in plane of the top VCSEL 800 surface. A bottom inconspicuous conductive trace 910 is supported by the transparent baseplate 904 and electrically coupled to the bottom electrical terminal 906. A planarization layer 912 surrounding the VCSEL 800 is deposited on the substrate up to the level of the top electrical terminal 908. In some embodiments, the planarization layer 912 is processed, e.g. etched, to expose the top electrical terminal 908 for an electrical contact. Then, a top inconspicuous conductive trace 914 can be formed. The top inconspicuous conductive trace 914 may be in electrical contact with the top terminal 908 of the VCSEL 800 through a small via 915. The illumination substrate 900 has a smaller overall thickness as compared with a wirebonded illumination substrate. The illumination substrate 900 has a portion of the inconspicuous conductive traces, that is, the bottom inconspicuous conductive traces 910 supported by the transparent baseplate 904, and another portion of the inconspicuous conductive traces, that is, the top inconspicuous conductive traces 914, supported by the planarization layer 912 resting on the transparent baseplate 904. In such a configuration, wirebonds may only need to be used at edges of the illumination substrate 900. The wirebonds may be protected by an edge encapsulation layer, not shown, without having to increase the overall thickness of the entire illumination substrate.

Figure 10A:
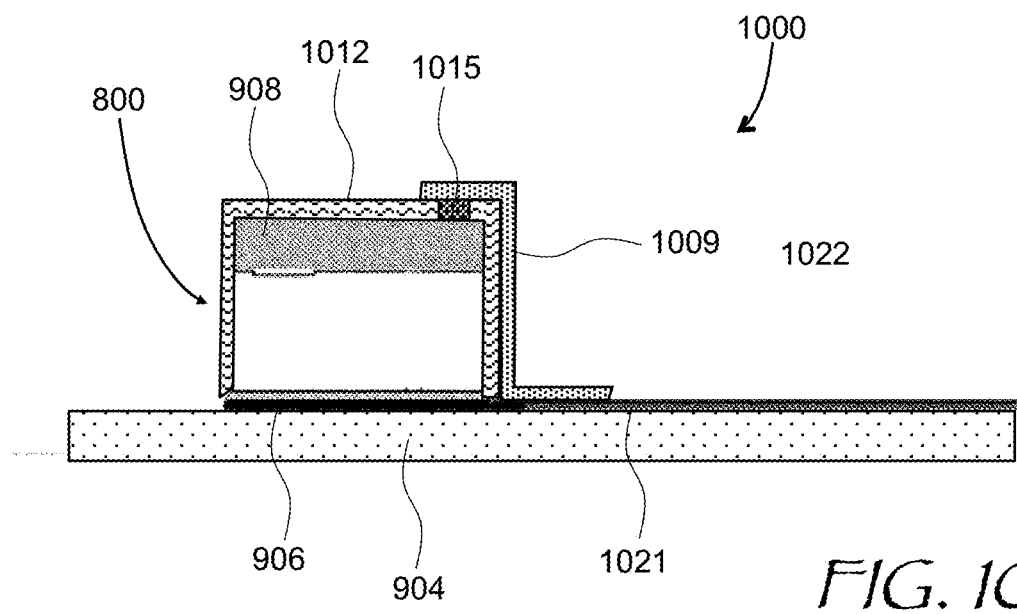
FIG. 10A is a side cross-sectional view of an illumination substrate supporting the near-eye VCSEL illuminator of FIG. 8 and having inconspicuous conductive traces at one level.
Figure 10B:
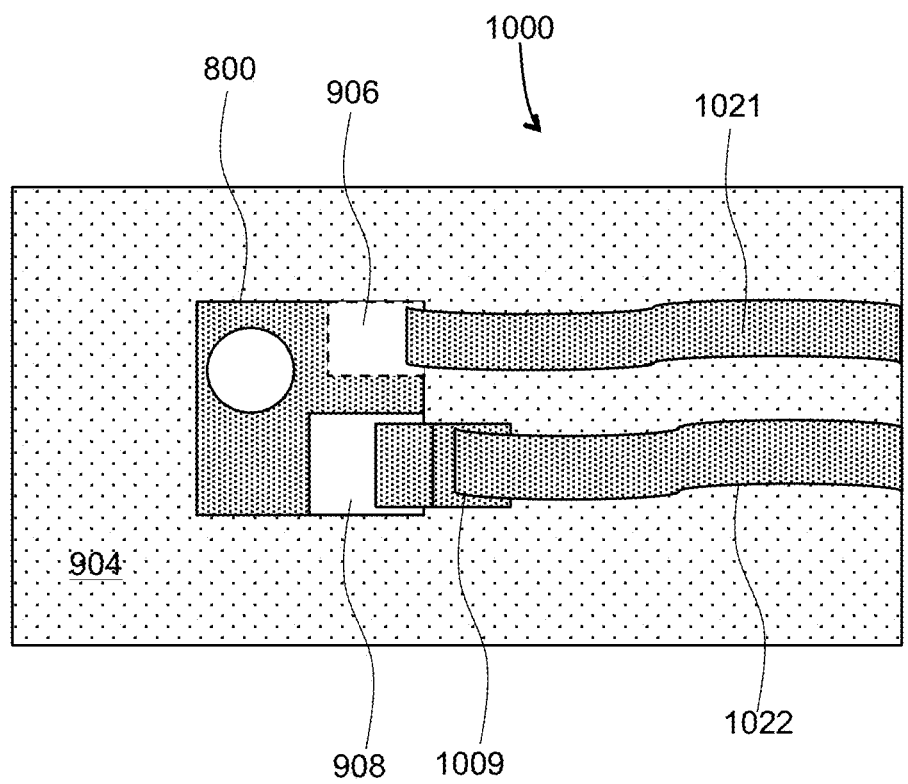
FIG. 10B is a top view of the illumination substrate of FIG. 10A.

Referring to FIGS. 10A and 10B, an illumination substrate 1000 includes the VCSEL 800 of FIG. 8 supported by the transparent baseplate 904. The VCSEL 800 has the bottom electrical terminal 906 in plane of the transparent baseplate 904, and the top electrical terminal 908 in plane of the top surface of the VCSEL 800. A passivation layer 1012 is formed on the VCSEL 800 over the top terminal 908 and sidewalls of the VCSEL 800. A conductor 1009 is then formed, e.g. by printing a conductive ink, on the passivation layer 1012. The conductor 1009 can be electrically coupled to the top electrical terminal 908 by a small via 1015. A first inconspicuous conductive trace 1021 is supported by the transparent baseplate 904 and electrically coupled to the bottom electrical terminal 906. A second inconspicuous conductive trace 1022 is supported by the transparent baseplate 904 and electrically coupled to the conductor 1009. The top electrical terminal 908 is in electrical contact with the second conductive trace 1022 by the conductor 1009 formed on the passivation layer 1012.

Figure 11:
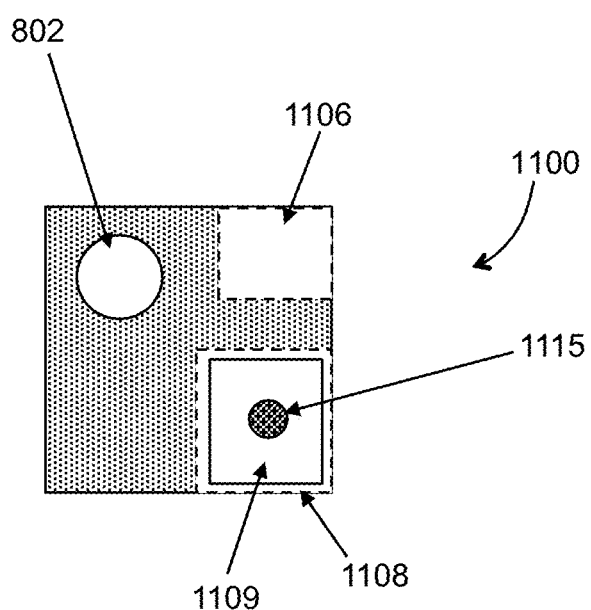
FIG. 11 is a schematic top view of an inconspicuous near-eye vertical cavity surface emitting laser (VCSEL) illuminator including a via to a bottom terminal.

Turning to FIG. 11, a VCSEL 1100 is similar to the VCSEL 800 of FIG. 8. The VCSEL 1100 is another example of an inconspicuous semiconductor illuminator suitable for eye region illumination in NET devices. The VCSEL 1100 includes a first electrical terminal 1106 disposed at the bottom of the VCSEL 1100, and a second electrical terminal 1108 connected to a top electrical contact 1109 of the VCSEL 1100 by a via 1115. Both the first 1106 and second 1108 electrical terminals of the VCSEL 1100 are disposed at the bottom of the VCSEL 1100, allowing all electrical connections to be done at the substrate (baseplate) level.

Figure 12A:
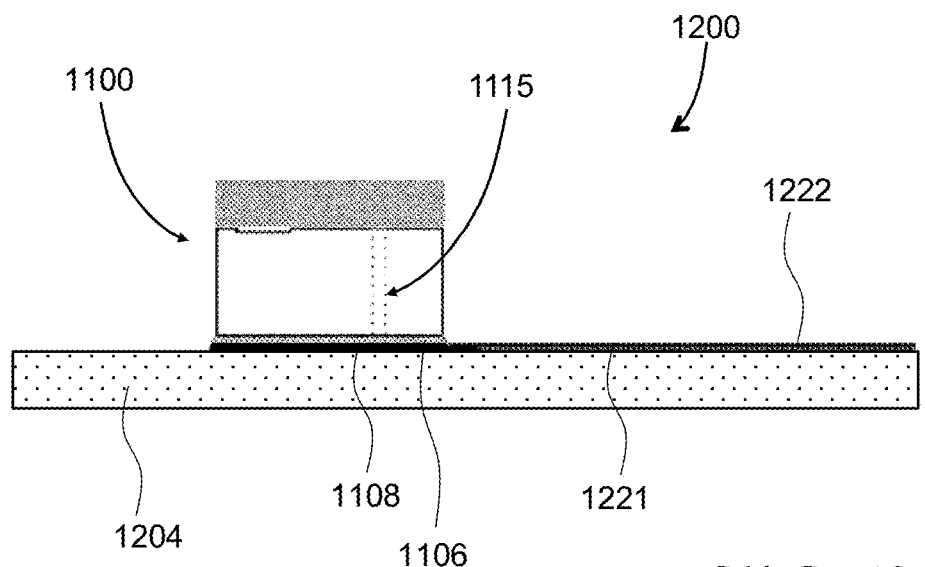
FIG. 12A is a side cross-sectional view of an illumination substrate supporting the near-eye VCSEL illuminator of FIG. 11.
Figure 12B:
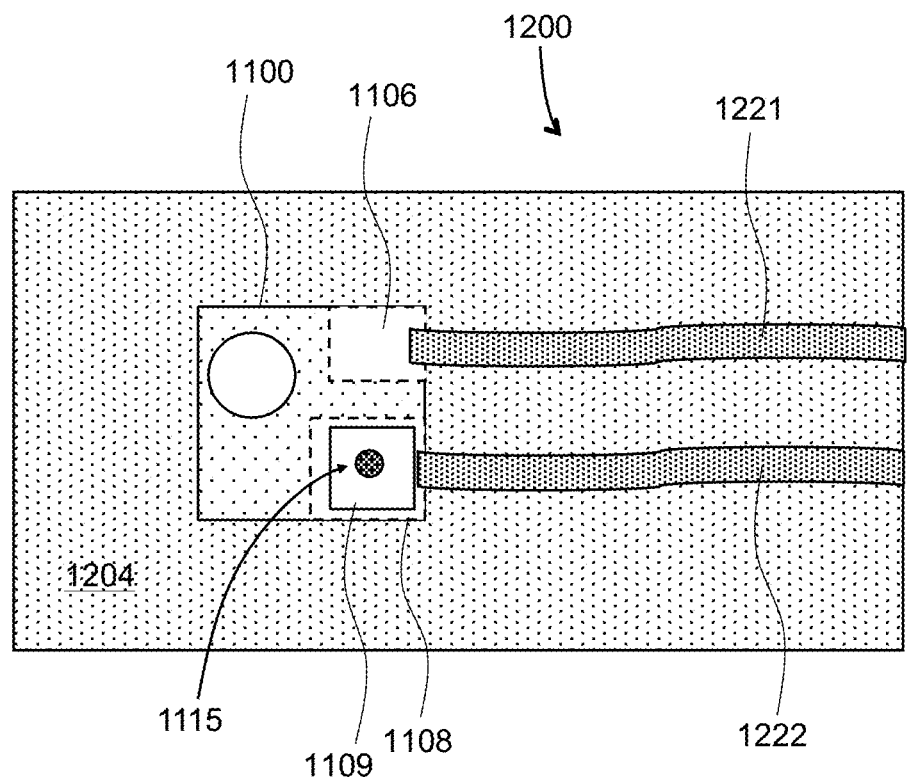
FIG. 12B is a top view of the illumination substrate of FIG. 12A.

Referring now to FIGS. 12A and 12B, an illumination substrate 1200 is similar to the illumination substrate 1000 of FIGS. 10A and 10B. The illumination substrate 1200 of FIGS. 12A and 12B includes the VCSEL 1100 of FIG. 11 supported by a transparent baseplate 1204. The VCSEL 1100 has the first 1106 and second 1108 electrical terminals in plane of the transparent baseplate 1204 (FIG. 12A). A first inconspicuous conductive trace 1221 is supported by the transparent baseplate 1204 and electrically coupled to the first electrical terminal 1206. A second inconspicuous conductive trace 1222 is supported by the transparent baseplate 1204 and electrically coupled to the second electrical terminal 1208. The top electric terminal 1109 is in electrical contact with the second conductive trace 1022 through the via 1115 in the VCSEL 1100. It is noted that other type of inconspicuous illuminator electrical components may be used in place of the VCSELs 800 and 1100, i.e. inconspicuous semiconductor illuminators including light-emitting diodes (LEDs), side-emitting laser diodes, etc.

Figure 13A:
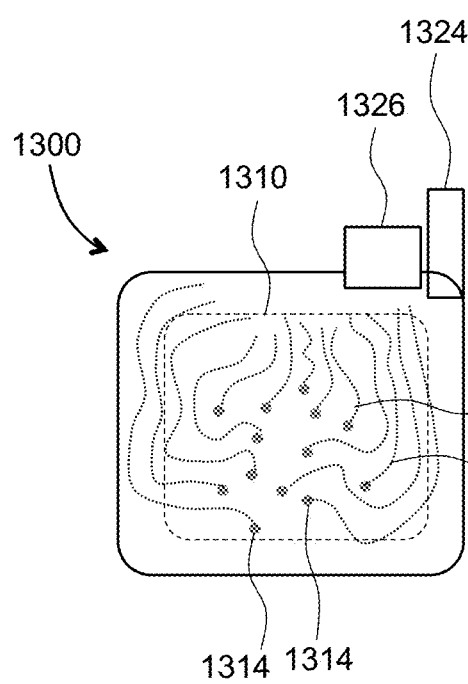
FIGS. 13A and 13B are schematic frontal and side cross-sectional side views, respectively, of a near-eye display according to an embodiment.
Figure 13B:
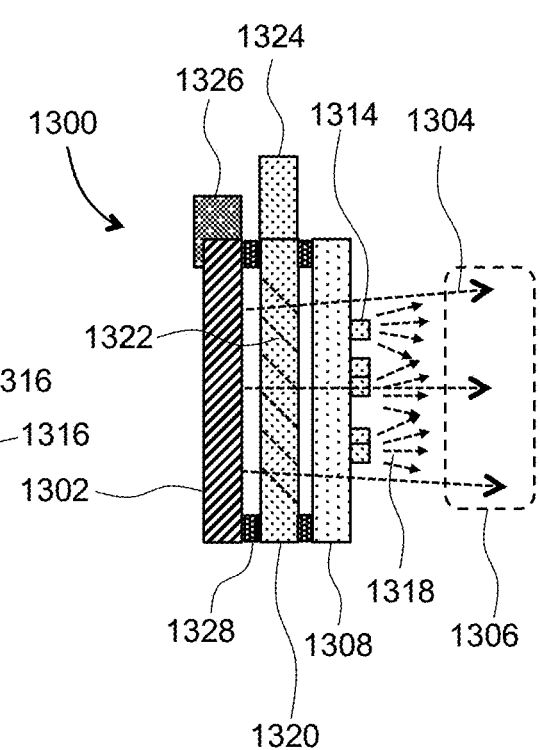

Turning to FIGS. 13A and 13B, a near-eye display (NED) 1300 includes an electronic display 1302 for providing display light 1304 carrying an image to be displayed to an eyebox 1306 of the NED 1300. The eyebox 1306 is a geometrical area where image of an acceptable quality may be displayed to the user. An illumination substrate 1308 has a clear aperture 1310 (FIG. 13A) in a field of view of the NED 1300. The illumination substrate 1308 is transparent to the display light 1304 in the clear aperture 1310, allowing the display light 1304 to propagate through the clear aperture 1310 to the eyebox 1306. A plurality of inconspicuous illuminators 1314, disposed in an inconspicuous pattern, e.g. any of the patterns of FIGS. 3A to 3F described above, are supported by the illumination substrate 1308 (FIG. 13B) in the clear aperture 1310 of the illumination substrate 1308. The inconspicuous illuminators 1314 are electrically coupled to a plurality of inconspicuous conductive traces 1316 disposed in an inconspicuous pattern, e.g. any of the patterns of FIGS. 3A to 3F described above, for providing electrical power to the plurality of inconspicuous illuminators 1314, which generate illuminating light 1318 when energized. Typically, a near-infrared light, with a wavelength of between 700 nm and 1100 nm, is used for illumination of the user's eye area. The near-infrared light with a wavelength of between 700 nm and 1100 nm is not visible by a human eye while being detectable by commonly used silicon sensors.

The NED 1300 may further include an imaging substrate 1320. The imaging substrate 1320 performs the function of collecting light reflected from the eye area. Just like the illumination substrate 1308, the imaging substrate 1320 is transparent to the display light 1304 in the clear aperture 1310. The imaging substrate 1320 may include reflective or diffractive optics 1322 redirecting a least a portion of the illuminating light reflected from the eye region towards an imaging system 1324, which collects the reflected light and obtains an image of the eye region. A position of the eye pupil in the obtained image may then be determined. Positions of glints from the illuminators 1314 are also determined, and the corresponding originating illuminators 1314 are then identified. From this information, one can determine the gaze direction in real time with a good fidelity.

In some embodiments, the electronic display 1302 is based on a pupil-replicating waveguide, which can be configured for guiding the display light generated by a projector 1326 via a series of total internal reflections from it's outer surfaces, and outputting the display light at a plurality of offset locations at the proximal outer surface, that is, the surface facing the user and the eyebox 1306, of the pupil-replicating waveguide. In FIG. 13B, the proximal outer surface of the pupil-replicating waveguide is facing a distal surface, that is, a surface away from the user and the eyebox 1306, of the imaging substrate 1320. The illumination substrate 1308, the imaging substrate 1320, and the pupil-replicating waveguide of the display substrate 1302 are disposed in a stack configuration, with spacers 1328 defining required distances between the substrates. The relative position of the substrates may vary, e.g. the electronic display 1302 may be the closest substrate to the eyebox 1306.

Figure 14:
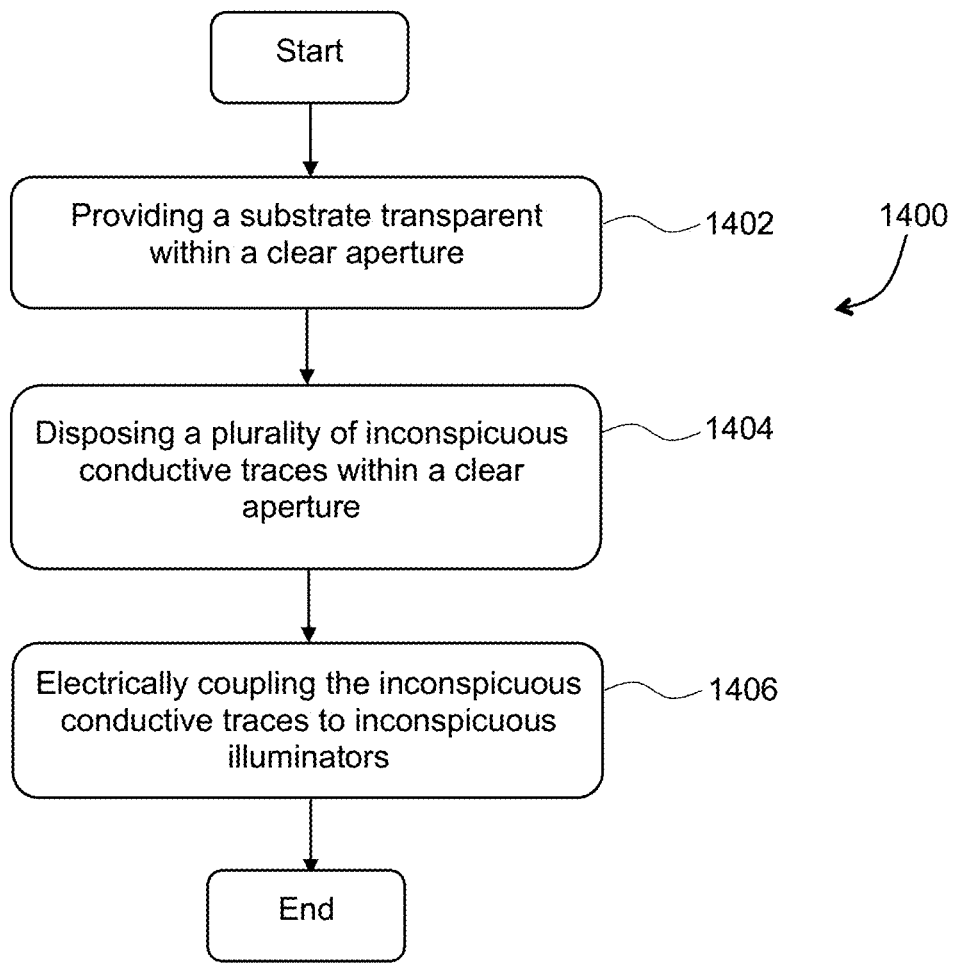
FIG. 14 is a flow chart of a method of manufacturing a near-eye optic.

Referring to FIG. 14, a method 1400 of manufacturing an NEO such as an NET, an illumination substrate, or any of the NEOs of FIGS. 5A to 5C, includes providing (1402) a substrate, e.g. a glass, sapphire, film, or plastic substrate having a clear aperture for propagating light through the substrate. A plurality of inconspicuous conductive traces is disposed (1404) in an inconspicuous pattern, e.g. any pattern of FIGS. 3A to 3F, on the substrate. The plurality of inconspicuous conductive traces is electrically coupled (1406) to a plurality of inconspicuous electrical components supported by the substrate in the clear aperture of the substrate.

In some embodiments, the traces are made of metal such as gold, silver, or copper; a transparent conductor e.g. a conductive oxide such as indium tin oxide, for example; and/or a more advanced material such as graphene. The traces may be defined using photolithography. First, a conductive layer is deposited on a transparent substrate of the NED. Then, a photoresist layer is deposited and exposed to a light pattern comprising positive or negative image of the required trace pattern. Then, the unexposed photoresist areas are etched, followed by etching of the exposed conductive layer areas to produce the traces. In some embodiments, the photoresist may be disposed directly onto a substrate and then exposed and etched away. Metal can be plated into the exposed areas, and the remaining photoresist may then be stripped.

In some embodiments, the traces may be formed by laser ablation. A transparent substrate is coated with a thin metal or transparent oxide layer, and a high-intensity laser, e.g. a femtosecond fiber laser, may then be used to selectively ablate the metal to form metal or transparent oxide traces. The peak intensity of laser pulses is high enough to cause ablation, that is, removal of the deposited conductive layer substantially without introduction of any significant heating.

The traces may also be printed using a suitable method capable of forming electrically conductive ink traces on a transparent surface. In some embodiments, electrically conductive thin lines are printed on the surface by Intaglio printing process using a conductive paint. The paint is loaded into depressions in a printing plate or drum, and the latter is brought into a close contact with the substrate to be printed upon. Pressure may be used to facilitate the paint transfer.

Screen printing with a conductive paint or paste brought in contact with the substrate via a screen or mask, may also be employed. In some embodiments, the conductive traces may be printed e.g. using a flexographic printing process, or another type of printing process. Conductive inks may be printed on the substrate using an ink jet printing process, for example.

Figure 15A:
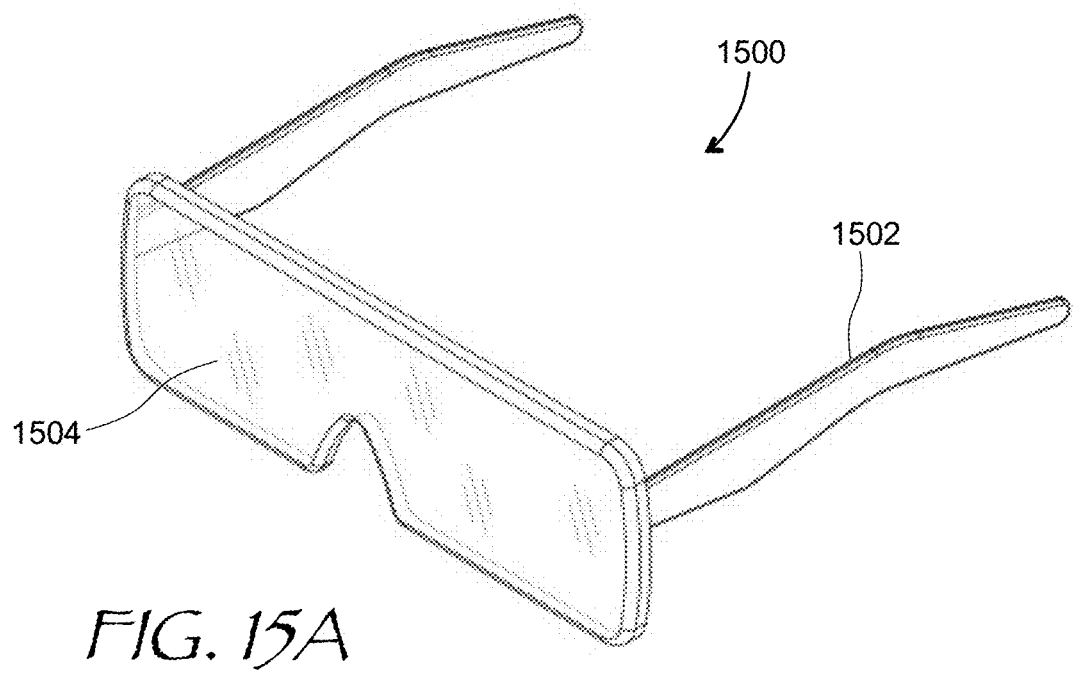
FIG. 15A is an isometric view of an eyeglasses form factor near-eye artificial reality (AR)/virtual reality (VR) display incorporating inconspicuous conductive traces of the present disclosure.
Figure 15B:
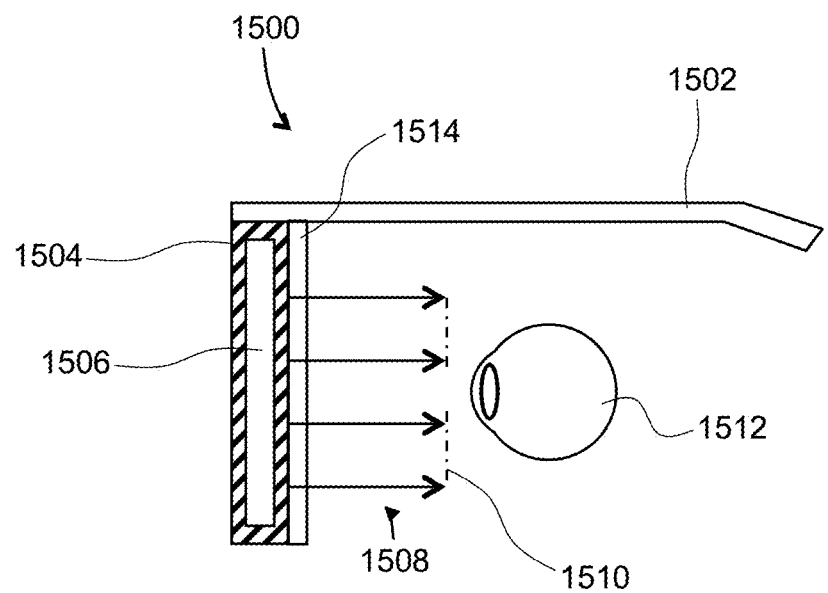
FIG. 15B is a side cross-sectional view of the near-eye AR/VR display of FIG. 15A.

Referring to FIGS. 15A and 15B, a near-eye artificial reality (AR)/virtual reality (VR) display 1500 is an embodiment of a NED, or more generally an embodiment of a wearable display. A body or frame 1502 of the near-eye AR/VR display 1500 has a form factor of a pair of eyeglasses, as shown. A display 1504 includes a display assembly 1506 (FIG. 15B), which provides image light to an eyebox 1510. The display assembly 1506 may include a separate display module for each eye, or one display module for both eyes.

The near-eye AR/VR display 1500 may include an NET 1514, e.g. any NET of the present disclosure, including illuminators e.g. the VCSELs 800 of FIG. 8 or the VCSEL 1100 of FIG. 11, for illuminating the eye 1512 with infrared beams 1508, and an imaging system for taking images of illuminated eye 1512 with glints from the illuminators and, based on the glints and the detected eye pupil, determining the gaze direction of the user's eye 1512. The illuminators may be disposed on or near inner surface of the display assembly 1506, with electric leads inconspicuously placed on the display assembly 1506. The determined gaze direction and vergence angle may also be used for real-time compensation of visual artifacts dependent on the angle of view and eye position. Furthermore, the determined eye 1512 vergence and gaze angle may be used for dynamic interaction with the user.

Figure 16:
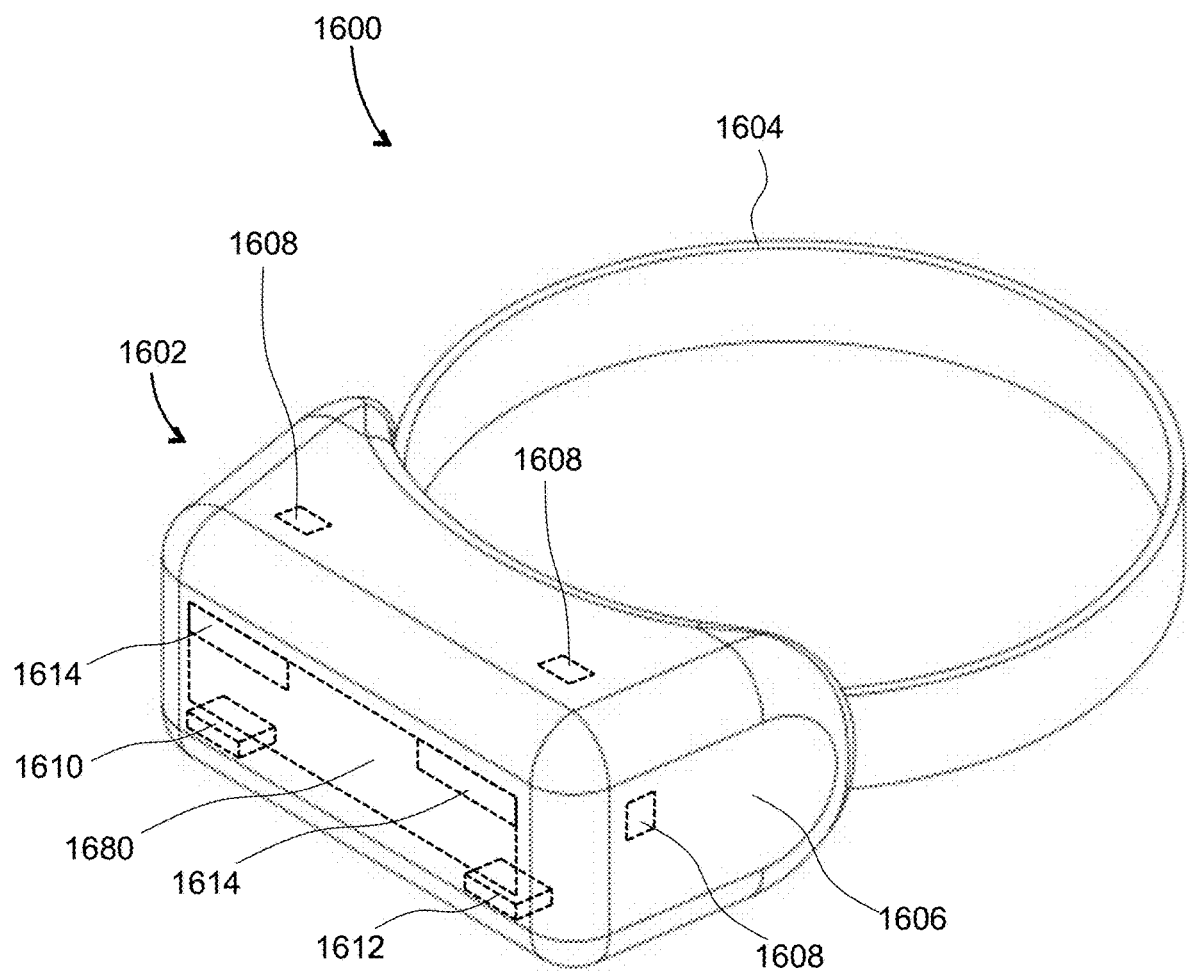
FIG. 16 is an isometric view of an HMD incorporating inconspicuous conductive traces of the present disclosure.

Turning to FIG. 16, a head-mounted display (HMD) 1600 is an example of an AR/VR wearable display system which encloses the user's face, for a greater degree of immersion into the AR/VR environment. The HMD 1600 can present content to a user as a part of an AR/VR system, not shown. The AR/VR system may further include a user position and orientation tracking system, an external camera, a gesture recognition system, control means for providing user input and controls to the system, and a central console for storing software programs and other data for interacting with the user for interacting with the AR/VR environment. The function of the HMD 1600 is to augment views of a physical, real-world environment with computer-generated imagery, and/or to generate the entirely virtual 3D imagery. The HMD 1600 may include a front body 1602 and a band 1604. The front body 1602 is configured for placement in front of eyes of a user in a reliable and comfortable manner, and the band 1604 may be stretched to secure the front body 1602 on the user's head. A display system 1680 is disposed in the front body 1602 for presenting AR/VR imagery to the user. An electronic display of the display system may include, for example and without limitation, a liquid crystal display (LCD), an organic light emitting display (OLED), an inorganic light emitting display (ILED), an active-matrix organic light-emitting diode (AMOLED) display, a transparent organic light emitting diode (TOLED) display, a projector, or a combination thereof. Sides 1606 of the front body 1602 may be opaque or transparent.

In some embodiments, the front body 1602 includes locators 1608, an inertial measurement unit (IMU) 1610 for tracking acceleration of the HMD 1600, and position sensors 1612 for tracking position of the HMD 1600. The locators 1608 are traced by an external imaging device of a virtual reality system, such that the virtual reality system can track the location and orientation of the entire HMD 1600. Information generated by the IMU and the position sensors 1612 may be compared with the position and orientation obtained by tracking the locators 1608, for improved tracking of position and orientation of the HMD 1600. Accurate position and orientation is important for presenting appropriate virtual scenery to the user as the latter moves and turns in 3D space.

The HMD 1600 further includes an eye tracking system 1614 including in-sight illuminators, e.g. VCSELs, and an imaging camera, one tracking system 1614 for each eye. The eye tracking systems 1614 which determine orientation and position of user's eyes in real time. The obtained position and orientation of the eyes allows the HMD 1600 to determine the gaze direction of the user and to adjust the image generated by a display system 1680 accordingly. The determined gaze direction and vergence angle may also be used for real-time compensation of visual artifacts dependent on the angle of view and eye position. Furthermore, the determined vergence and gaze angles may be used for interaction with the user, highlighting objects, bringing objects to the foreground, creating additional objects or pointers, etc. An audio system may also be provided including e.g. a set of small speakers built into the front body 1602.

What is claimed is:

1. A near-eye optic (NEO) comprising:
a substrate having a clear aperture for propagating outside light for viewing an outside environment through the clear aperture; and
an electrical circuit supported by the substrate within the clear aperture of the substrate, wherein the electrical circuit comprises a plurality of conductive traces disposed in an inconspicuous pattern and electrically coupled to a plurality of inconspicuous electrical components;
wherein the inconspicuous pattern comprises a periodic pattern modulated with pseudo-random perturbations, wherein amplitudes of the pseudo-random perturbations are less than 2000× widths of the conductive traces.

2. The NEO of claim 1, wherein the inconspicuous pattern comprises at least one of: an asymmetric pattern, an aperiodic pattern, a pseudo-random pattern, a meandering pattern, or a non-rectangular pattern modulated with pseudo-random perturbations.

3. The NEO of claim 1, wherein the plurality of conductive traces lacks conductive traces disposed within 12 degrees of an optic axis of the clear aperture.

4. The NEO of claim 1, wherein the substrate is transparent for visible light across the clear aperture.

5. The NEO of claim 1, comprising at least one of: a display, a prescription lens, an active focusing optic, an attenuator, a shutter, or a near-eye tracker.

6. The NEO of claim 1, wherein lengths of the pseudo-random perturbations are less than ⅓ of total lengths of the conductive traces and at least 2× widths of the conductive traces.

7. The NEO of claim 1, wherein the conductive traces comprise metal traces defined by photolithography and at least one of etching or plating.

8. The NEO of claim 1, wherein the conductive traces comprise conductive ink traces formed by at least one of Intaglio printing, screen printing, flexographic printing, or ink jet printing.

9. The NEO of claim 1, wherein the conductive traces comprise a transparent conductor comprising at least one of an oxide or graphene.

10. The NEO of claim 9, wherein the transparent conductor is defined by at least one of laser ablation or shadow masking.

11. The NEO of claim 9, wherein the transparent conductor is defined by photolithography and at least one of etching or plating.

12. An illumination substrate comprising:
a transparent baseplate having a clear aperture for propagating external light for viewing an outside environment to an eye region of a user;
a plurality of conductive traces disposed in an inconspicuous pattern, wherein at least a portion of the plurality of conductive traces is supported by the transparent baseplate in the clear aperture thereof; and
a plurality of inconspicuous semiconductor illuminators configured for illuminating the eye region, supported by the transparent baseplate in the clear aperture thereof, and electrically coupled to the plurality of conductive traces;
wherein the inconspicuous pattern comprises a periodic pattern modulated with pseudo-random perturbations, wherein amplitudes of the pseudo-random perturbations are less than 2000× widths of the conductive traces.

13. The illumination substrate of claim 12, wherein the inconspicuous pattern comprises at least one of: an asymmetric pattern, an aperiodic pattern, a pseudo-random pattern, a meandering pattern, or a non-rectangular pattern modulated with pseudo-random perturbations.

14. The illumination substrate of claim 12, further comprising a planarization layer supported by the transparent baseplate and surrounding each semiconductor illuminator of the plurality of inconspicuous semiconductor illuminators, wherein at least a portion of the conductive traces is supported by the planarization layer.

15. The illumination substrate of claim 12, wherein each inconspicuous semiconductor illuminator of the plurality of inconspicuous semiconductor illuminators comprises top and bottom electric terminals and a passivation layer, wherein the top electric terminal is in electrical contact with a conductive trace of the plurality of conductive traces by a conductor formed on the passivation layer.

16. The illumination substrate of claim 12, wherein each inconspicuous semiconductor illuminator of the plurality of inconspicuous semiconductor illuminators comprises top and bottom electric terminals, wherein the top electric terminal is in electrical contact with a conductive trace of the plurality of conductive traces through a via in the inconspicuous semiconductor illuminator.

17. A method for manufacturing a near-eye optic (NEO), the method comprising:
providing a substrate having a clear aperture for propagating outside light for viewing an outside environment through the clear aperture;
disposing a plurality of conductive traces in an inconspicuous pattern on the substrate, wherein the inconspicuous pattern comprises a periodic pattern modulated with pseudo-random perturbations, and wherein lengths of the pseudo-random perturbations are less than ⅓ of total lengths of the conductive traces and at least 2× widths of the conductive traces; and
electrically coupling the plurality of conductive traces to a plurality of inconspicuous electrical components supported by the substrate in the clear aperture thereof.

18. The method of claim 17, wherein the conductive traces comprise metal traces, the method further comprising defining the metal traces by photolithography and at least one of etching or plating.

19. The method of claim 17, wherein the conductive traces comprise conductive ink traces, the method further comprising forming the conductive ink traces by at least one of: Intaglio printing, screen printing, flexographic printing, or ink jet printing.

* * * * *